US008728945B2

(12) United States Patent
Lytle

(10) Patent No.: US 8,728,945 B2
(45) Date of Patent: May 20, 2014

(54) METHOD FOR PATTERNING SUBLITHOGRAPHIC FEATURES

(75) Inventor: Steven Alan Lytle, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 150 days.

(21) Appl. No.: 13/288,756

(22) Filed: Nov. 3, 2011

(65) Prior Publication Data
US 2012/0108068 A1 May 3, 2012

Related U.S. Application Data

(60) Provisional application No. 61/409,592, filed on Nov. 3, 2010.

(51) Int. Cl.
*H01L 21/311* (2006.01)

(52) U.S. Cl.
USPC ........... 438/696; 438/723; 438/724; 438/742; 438/743; 438/744; 257/E21.249

(58) Field of Classification Search
None
See application file for complete search history.

(56) References Cited

U.S. PATENT DOCUMENTS

| | | | |
|---|---|---|---|
| 5,328,810 A * | 7/1994 | Lowrey et al. | 430/313 |
| 7,118,988 B2 * | 10/2006 | Buerger et al. | 438/437 |
| 7,335,580 B1 * | 2/2008 | Buerger et al. | 438/584 |
| 7,759,239 B1 * | 7/2010 | Lin et al. | 438/592 |
| 7,985,682 B2 * | 7/2011 | Matsuzaki | 438/694 |
| 8,197,915 B2 * | 6/2012 | Oka et al. | 427/579 |
| 8,389,407 B2 * | 3/2013 | Sipani et al. | 438/675 |
| 2002/0149031 A1 * | 10/2002 | Kim et al. | 257/192 |
| 2003/0215989 A1 * | 11/2003 | Kim et al. | 438/157 |
| 2003/0230234 A1 * | 12/2003 | Nam et al. | 117/97 |
| 2004/0018738 A1 * | 1/2004 | Liu | 438/700 |
| 2005/0079721 A1 * | 4/2005 | Buerger et al. | 438/696 |
| 2005/0250345 A1 * | 11/2005 | Sun et al. | 438/778 |
| 2005/0280152 A1 * | 12/2005 | Fitzsimmons et al. | 257/750 |
| 2005/0285161 A1 * | 12/2005 | Kang et al. | 257/288 |
| 2006/0017119 A1 * | 1/2006 | Jin et al. | 257/401 |
| 2006/0151826 A1 * | 7/2006 | Jin et al. | 257/316 |
| 2007/0077754 A1 * | 4/2007 | Ngo et al. | 438/627 |
| 2008/0111198 A1 * | 5/2008 | Jang et al. | 257/392 |
| 2008/0179693 A1 * | 7/2008 | Kim et al. | 257/401 |
| 2008/0214009 A1 * | 9/2008 | Lee et al. | 438/696 |
| 2008/0248625 A1 * | 10/2008 | Cheng et al. | 438/386 |
| 2009/0001050 A1 * | 1/2009 | Min | 216/51 |
| 2009/0020798 A1 * | 1/2009 | Lee et al. | 257/303 |
| 2009/0032963 A1 * | 2/2009 | Tran | 257/774 |
| 2009/0108248 A1 * | 4/2009 | Klostermann et al. | 257/2 |
| 2009/0108341 A1 * | 4/2009 | Chung | 257/329 |
| 2009/0136876 A1 * | 5/2009 | Chen et al. | 430/322 |
| 2009/0166725 A1 * | 7/2009 | Lee | 257/329 |
| 2009/0206443 A1 * | 8/2009 | Juengling | 257/506 |
| 2009/0236656 A1 * | 9/2009 | Sung et al. | 257/329 |
| 2009/0325359 A1 * | 12/2009 | Liu et al. | 438/424 |
| 2010/0093175 A1 * | 4/2010 | Niroomand et al. | 438/694 |
| 2010/0151649 A1 * | 6/2010 | Suk et al. | 438/303 |
| 2010/0173494 A1 * | 7/2010 | Kobrin | 438/694 |
| 2010/0248437 A1 * | 9/2010 | Kim et al. | 438/270 |
| 2011/0101467 A1 * | 5/2011 | Jang et al. | 257/392 |
| 2011/0121403 A1 * | 5/2011 | Lee et al. | 257/390 |

(Continued)

*Primary Examiner* — Allan Olsen
(74) *Attorney, Agent, or Firm* — Wade J Brady, III; Frederick J. Telecky, Jr.

(57) ABSTRACT

A method of uniformly shrinking hole and space geometries by forming sidewalls of an ALD film deposited at low temperature on a photolithographic pattern.

8 Claims, 9 Drawing Sheets

(56) References Cited

U.S. PATENT DOCUMENTS

| | | | |
|---|---|---|---|
| 2011/0129991 A1* | 6/2011 | Armstrong et al. | 438/585 |
| 2011/0244688 A1* | 10/2011 | Ohsawa et al. | 438/702 |
| 2011/0285029 A1* | 11/2011 | Tran | 257/774 |
| 2011/0288497 A1* | 11/2011 | Goodall et al. | 604/264 |
| 2011/0304053 A1* | 12/2011 | Lin et al. | 257/774 |
| 2011/0318931 A1* | 12/2011 | Min et al. | 438/696 |
| 2012/0052668 A1* | 3/2012 | Lin | 438/589 |
| 2012/0080745 A1* | 4/2012 | Lee | 257/329 |
| 2012/0231622 A1* | 9/2012 | Chen et al. | 438/623 |
| 2013/0001739 A1* | 1/2013 | Wells et al. | 257/520 |
| 2013/0009323 A1* | 1/2013 | Lin et al. | 257/774 |

* cited by examiner

METHOD FOR PATTERNING SUBLITHOGRAPHIC FEATURES

This application claims the benefit of U.S. Provisional Application No. 61/409,592, filed Nov. 3, 2010, the entirety of which is herein incorporated by reference.

FIELD OF THE INVENTION

This invention relates to the field of integrated circuits. More particularly, this invention relates to uniformly shrinking photolithographically defined features in integrated circuits.

BACKGROUND OF THE INVENTION

Semiconductor geometries have been shrinking with each new technology node enabling more and more transistors to be built in the same area. The wavelength of light used to print the ever smaller geometries and spaces between geometries has remained at 193 nm for several generations because of difficulty in making manufacturable photoresists for 157 nm photolithography.

Typically design rules shrink by 30% in going from one technology node to the next to give approximately a 50% reduction in integrated circuit area. (0.7 length×0.7 width=0.49 area). Because of the limitation imposed by the wavelength of light upon the minimum size of geometries that may be printed, some design rules are not able to be reduced as desired. For example, geometries smaller than about 60 nm cannot be printed using 193 nm light, even with enhanced resists. This results in larger chip area and increased cost.

To form geometries smaller than the 193 nm photolithography capability, several geometry reduction techniques have been developed. For example, to form holes that are smaller than 60 nm, one technique is to print the holes at 60 nm and then to heat and reflow the resist causing the hole diameter to decrease by approximately 10 nm. While this technique works for small contact holes, the shape and resist profile of larger contact holes such as rectangular contacts found in SRAMs is unacceptably degraded.

Another technique is to deposit a polymer on the contact sidewalls during contact etch. This may form contacts with sloped sidewalls and a top dimension that is significantly larger than the bottom dimension.

Other techniques termed RELACS™ and SAFIER™ use the reaction between a spin-on polymer and the resist pattern to form a layer of additional polymer on the sides of the photoresist pattern. As with other conventional processes, large geometries such as rectangular contacts shrink more along the longitudinal dimension.

A conventional hole size reduction process is illustrated in FIG. 1. A minimum sized hole 1002 and a rectangular hole 1010 are formed in a dielectric layer 1000. The square 1002 and the rectangle 1010 represent the hole geometries as they appear on the reticle. The broken dashed lines 1004 and 1012 represent the holes as they appear post etch without a hole size reduction process. The solid lines 1006 and 1014 represent the holes as they appear post etch with a conventional hole size reduction process. As can be seen, with a conventional process the longitudinal hole size reduction 1016 is significantly larger than the lateral hole size reduction 1018. This requires the longitudinal hole size to be increased on the reticle to compensate for the additional shrinkage. This may cause the longitudinal hole size to be increased beyond lithographic printing capability in which case adjacent holes may merge when printing. To prevent this may require an increase in longitudinal pitch resulting in increased area and increased cost.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A method of uniformly shrinking hole and space geometries by forming sidewalls of an ALD film deposited at low temperature on a photolithographic pattern.

DETAILED DESCRIPTION OF EMBODIMENTS

Figure 1:
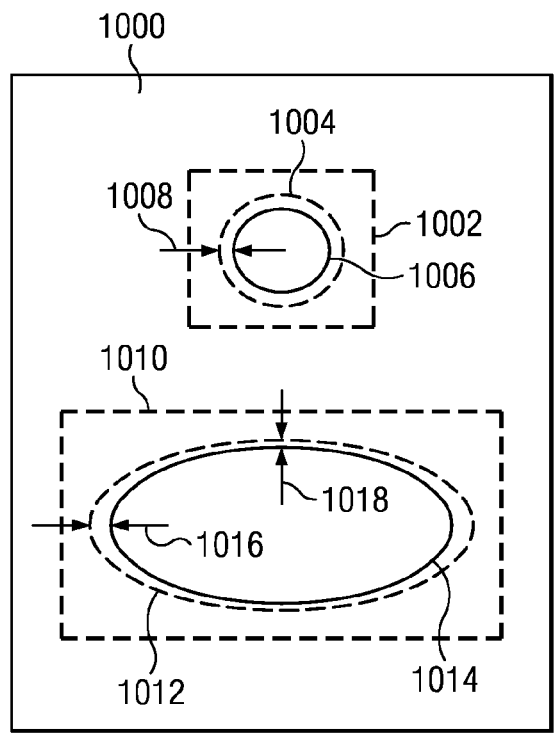
FIG. 1 is a top down view illustrating conventional shrinking of a minimum size contact and a rectangular contact.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The term "minimum size hole" or "minimum size space" refers to the minimum size hole or space that may be printed lithographically.

Figure 2:
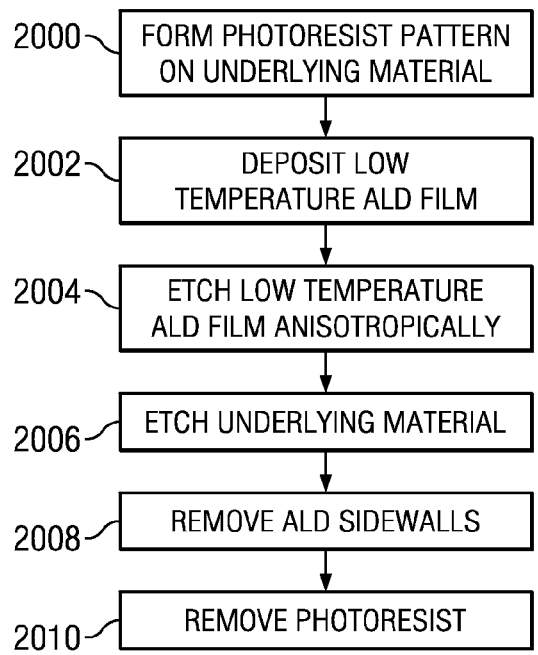
FIG. 2 is a flow diagram for forming sublithographic geometries according to an embodiment of the invention.

An embodiment flow for forming sublithographic geometries is illustrated in FIG. 2. Step 1 2000 is to form a photoresist pattern on underlying material. Step 2 2002 is to deposit an atomic layer deposition (ALD) film at a temperature sufficiently low to preserve the shape and profile of the underlying photoresist pattern. A low temperature ALD deposited thin film may be used because ALD films are very conformal across geometries with a large range in dimension. Other deposition techniques such as low temperature PECVD experience microloading effects which result in thinner deposition on the sidewalls of small and dense geometries and thicker sidewalls on larger and isolated geometries. Example ALD films that may be used include an ALD aluminum oxide film deposited at 100° C. or less, an ALD silicon dioxide film deposited at about 75° C., or a PEALD TiN film deposited at about 150° C.

In step 2004, the conformal ALD thin film is etched anisotropically to form sidewalls on the photoresist pattern. These sidewalls may reduce the size of minimum design rule size hole and may reduce the size of a of a minimum size space between to geometries to sublithographic dimensions.

In step 2006, the underlying material is etched to transfer the pattern into the underlying material. In the case of a via or contact pattern, the underlying material may be the dielectric layer itself or may be hardmask material overlying the dielectric. In the case of a gate or active pattern, the underlying material may be gate material or active material or may be hardmask material overlying the gate or active. A hardmask may not be necessary depending on the materials being used and the etch selectivities.

The ALD material is removed in step 2008 followed by removal of the photoresist material in step 2010. The preferred embodiment is illustrated here, but the ALD may be removed after or simultaneously with the photoresist depending upon the type of ALD thin film used.

Figure 3:
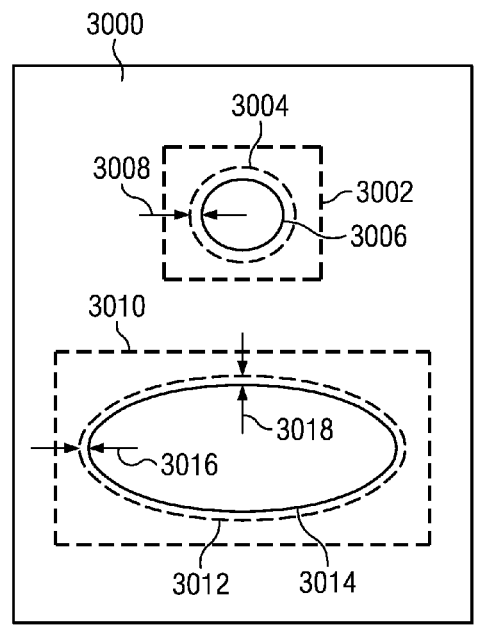
FIG. 3. is a top down view illustrating shrinking of a minimum size contact and a rectangular contact according to an embodiment of the invention.

FIG. 3 shows a top down view of a standard contact 3002 and a rectangular contact 3010 formed according to an embodiment of the invention. The dotted lines 3002 and 3010 indicate the geometries as they may appear on the reticle. The broken lines 3004 and 3012 indicate the geometries as they may appear in the photoresist pattern on a wafer. Solid lines 3006 and 3014 indicate the geometries formed according to an embodiment. A deposited and etched ALD thin film may form sidewalls on the resist to reduce a minimum sized contact 3002 to sublithographic dimensions and to uniformly reduce the size of the non minimum sized rectangular contact 3010. Unlike conventional processes illustrated in FIG. 1, which may reduce the longitudinal dimension 1016 more than the lateral dimension 1018 of a non minimum feature, this embodiment of the invention reduces both the longitudinal 3016 and the lateral 3018 dimensions equally.

FIG. 4A through 4E illustrate the steps in uniformly reducing the size of a hole pattern to sublithographic dimensions according to an embodiment using a topdown view (top) and also crossectional view (below).

The hole photolithographic pattern 4010 is formed over dielectric layer 4004 and underlying interconnect layer 4002. Layer 4006 may be an advanced patterning film (APF) or a planarizing spin-on film. Layer 4008 may be an antireflective coating (ARC) that may be spin-on or may be a thin film ARC such as SiON. In a example embodiment, layer 4006 is an amorphous carbon film with a thickness of approximately 90 nm that is deposited using PECVD and layer 4008 is a SiON thin film approximately 20 nm thick deposited using PECVD.

Figure 4A:
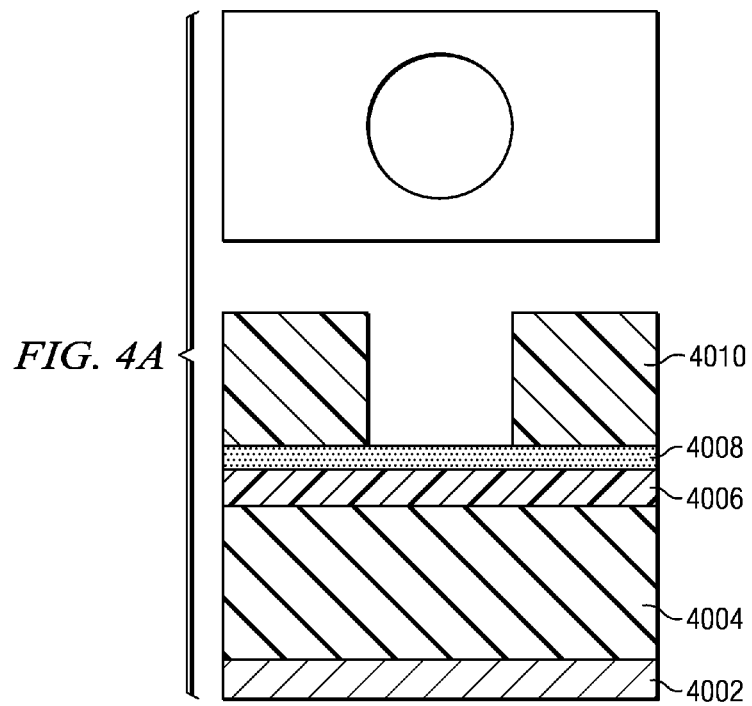
FIG. 4A through FIG. 4E are topdown and cross-sectional views showing the fabrication of hole geometries in an integrated circuit at various stages of manufacture formed according to embodiments of the invention.
Figure 4B:
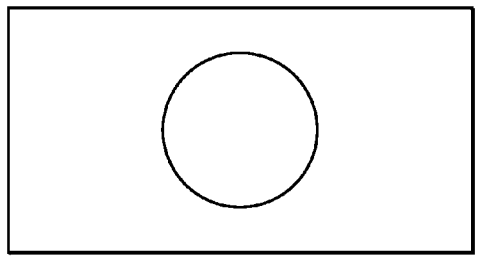
Figure 4B:
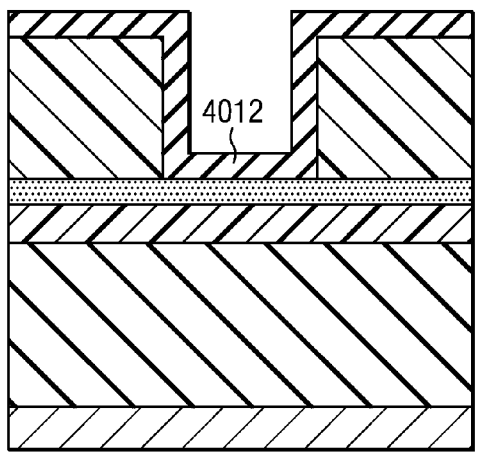

A low temperature ALD thin film 4012 is deposited conformally over the top, sidewalls, and bottom of the minimum sized hole geometry, as shown in FIG. 4B. The ALD deposition is very uniform and conformal on the sidewalls of all sized hole geometries. Low temperature deposition ensures the resist profiles are not altered. In a preferred embodiment, an Al2O3 ALD film approximately 15 nm thick is deposited over the hole photoresist pattern 4010.

Figure 4C:
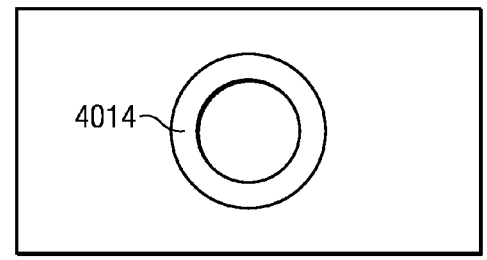
Figure 4C:
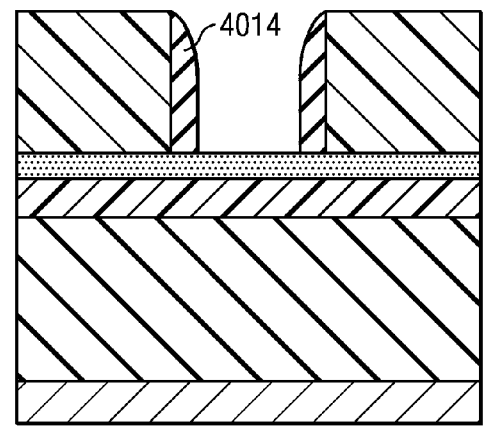

As shown in FIG. 4C, the ALD film is then anisotropically etched from the top of the photoresist pattern and the bottom of the geometry leaving Al2O3 ALD sidewalls 4014 on the vertical surfaces of the photoresist geometries. In an example embodiment, the Al2O3 ALD thin film is etched in a plasma etcher using well known techniques.

Figure 4D:
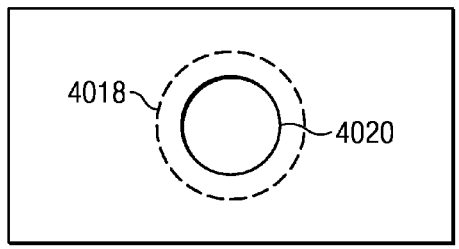
Figure 4D:
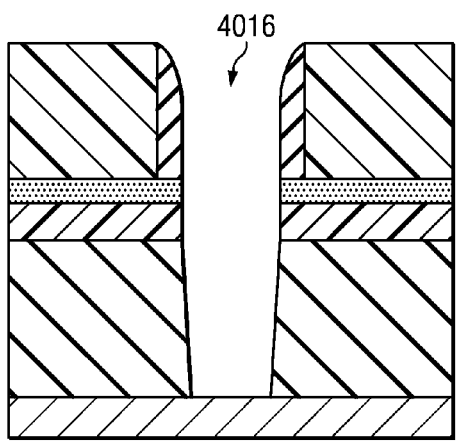

The ARC film 4008 and the APF 4006 are then etched if present, followed by dielectric 4004 etching to form the contact hole 4016, as shown in FIG. 4D. Broken dotted line 4018 in the top down view indicates the hole size on the photolithographic pattern and solid line 4020 indicates the size of the sublithographic hole produced according to the embodiment.

Figure 4E:
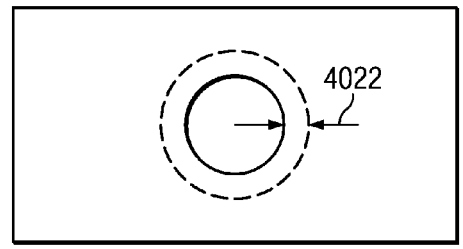
Figure 4E:
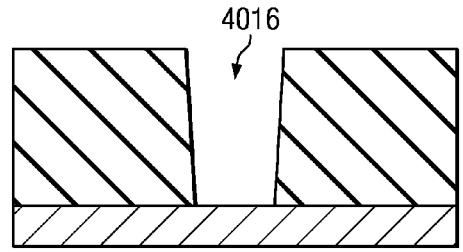

FIG. 4E shows the contact hole 4016 formed according to the embodiment after the pattern and ALD sidewalls are removed. The distance between the hole in the photoresist pattern and the hole formed according to this embodiment 4022, may be used if desired to shrink the hole design rule, thus shrinking the integrated circuit area and reducing cost.

Gate lengths typically have a sublithographic dimension. Gates are printed at approximately 60 nm or greater and then reduced to approximately 30 nm by isotropically etching the gate resist pattern before anisotropically etching the gate. When a one step gate pattern is used, the gate tip-to-gate tip space is printed at the lithographic limit, which may be about 70 nm. During the gate length reduction etch, this space may be increased by approximately 20 nm per side so that post etch, the gate tip-to-gate tip space may be increased to about 110 nm. One solution to reduce the gate tip-to-gate tip post etch space is to use a double pattern and etch process to form the transistor gates. The first gate pattern and etch leaves the gate tips connected during the gate length reduction etch. The second pattern cuts the gates apart so that the gate tip-to-gate tip space is not increased during etch.

FIGS. 5A through 5E illustrate the steps in uniformly reducing the gate tip-to-gate tip space to sublithographic dimensions during a second gate pattern and etch according to an embodiment of the invention.

Figure 5A:
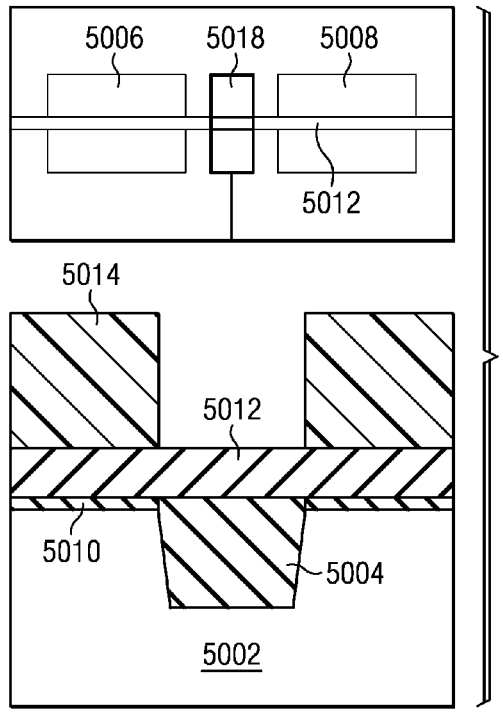
FIG. 5A through FIG. 5E are topdown and cross-sectional views showing the fabrication of gate geometries in an integrated circuit at various stages of manufacture formed according to embodiments of the invention.

FIG. 5A shows a second gate pattern to cut the gate tips apart. In the topdown view, a first transistor is to be formed over active area 5006 and a second transistor is to be formed over active area 5008. A transistor gate 5012 with sublithographic length is defined by the first gate pattern and etch. The hole 5018 in the photoresist pattern 5014 overlies the gate 5012 over the isolation area 5004. The gate 5012 material in the hole is etched during the second gate etch separating the two transistor gates. In the crossectional view below, the gate material 5012, is deposited on the gate dielectric 5010 and the isolation are 5004 which has been formed in the substrate 5002.

Figure 5B:
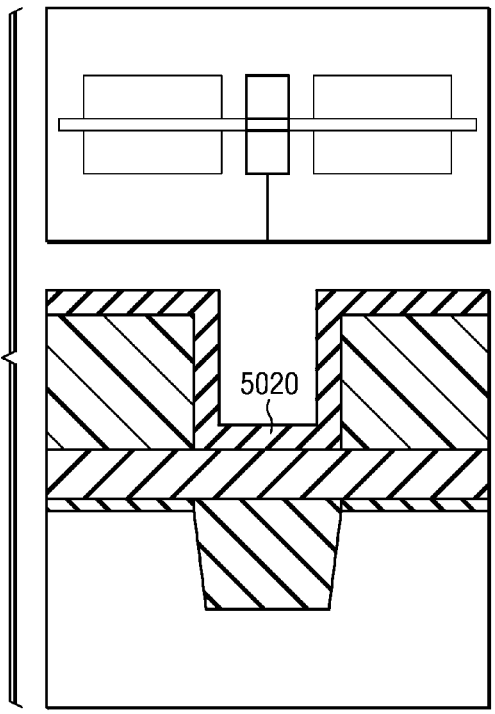
Figure 5C:
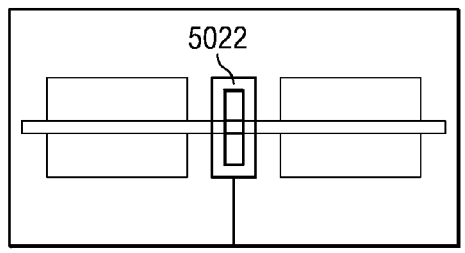
Figure 5C:
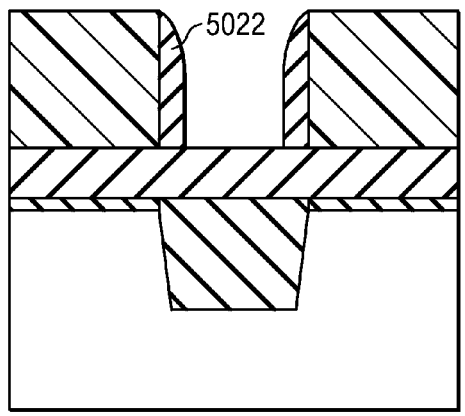

As shown in FIG. 5B, an ALD thin film 5020 is deposited and etched to form sidewalls 5022 on the resist 5014, as shown in FIG. 5C. In an example embodiment, the hole 5018 is patterned at 60 nm in the horizontal dimension and a 15 nm SiO2 ALD thin film is deposited at about 75 C.

Figure 5D:
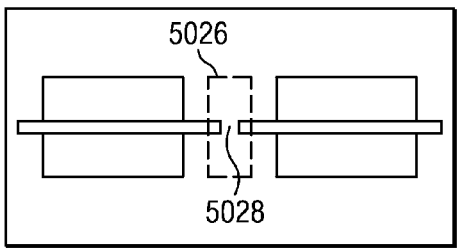
Figure 5D:
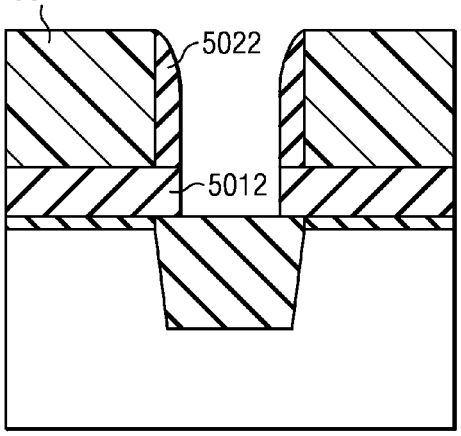

The gate material 5012 is etched in FIG. 5D forming a sublithographic gate tip-to-gate tip space 5028. If desired, the pattern may be etched into a hardmask and the pattern 5014 and ALD sidewalls 5022 removed prior to etching the gate material 5012. In an example embodiment, a gate tip-to-tip spacing printed at about 60 nm is reduced to about 30 nm using the embodiment.

Figure 5E:
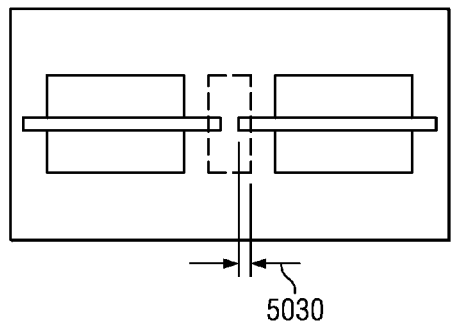
Figure 5E:
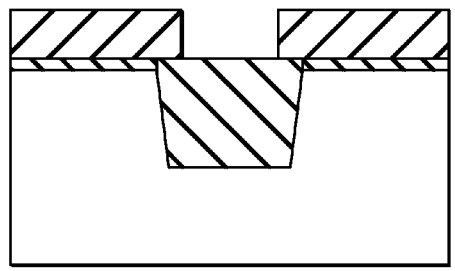

FIG. 5E shows the gate structure after second gate pattern and etch with the gate pattern and ALD sidewalls removed. The gate tip-to-gate tip space that is saved 5030 using the embodiment may be used to form a sublithographic gate tip-to-gate tip design rule which may be used to reduce integrated circuit area and to reduce cost.

Active-to-active space is a primary area limiting design rule in forming shallow trench isolation (STI). Post STI etch the sidewalls of the trench are typically oxidized prior to filling the trench with dielectric. This oxidation consumes silicon from the sidewalls of the trench causing the trench to become wider. Thus the minimum STI space on silicon may become larger than the minimum space allowed by photolithography. Minimum active spacing may be determined by electrical isolation in bulk silicon designs, but in SOI designs active spacing is usually determined solely by photolithography limits. Minimum active-to-active space is a major design rule for determining SRAM memory array area.

Figure 6A:
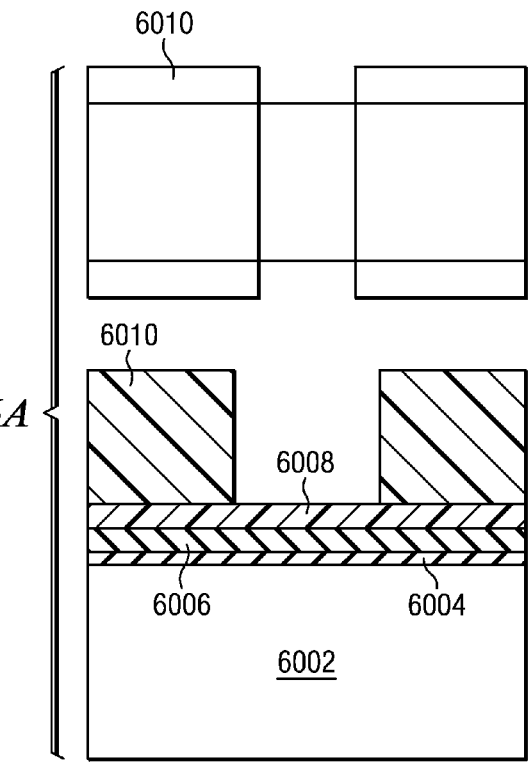
FIG. 6A through FIG. 6E are topdown and cross-sectional views showing the fabrication of active geometries in an integrated circuit at various stages of manufacture formed according to embodiments of the invention.

FIGS. 6A through 6E illustrate the steps in uniformly reducing active-to active space to sublithographic dimensions according to an embodiment of the invention. FIG. 6A shows topdown and crossectional views of a minimum space active pattern 6010. The pattern 6010 is formed on an APF 6008, silicon nitride layer 6006, pad oxide layer 6004, and substrate 6002.

Figure 6B:
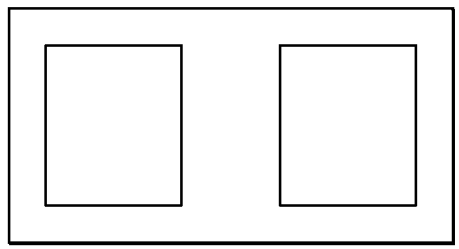
Figure 6B:
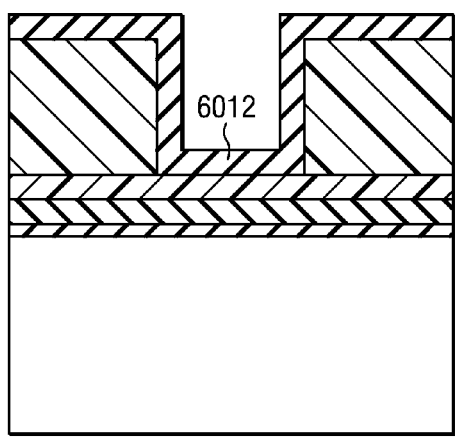
Figure 6C:
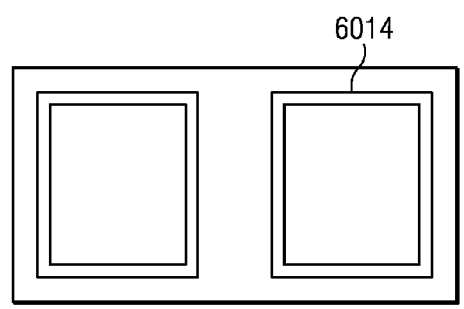
Figure 6C:
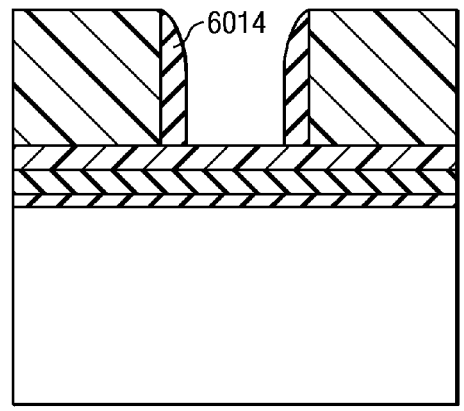

As before, an ALD thin film 6012 in FIG. 6B is deposited at low temperature and etched to form sidewalls 6014 on the resist 6010 as shown in FIG. 6C. In an example embodiment, the minimum active space is printed at 70 nm, and a SiO2 ALD thin film is deposited with a thickness of about 20 nm conformally over the active pattern to reduce the active space from 70 nm to approximately 30 nm.

Figure 6D:
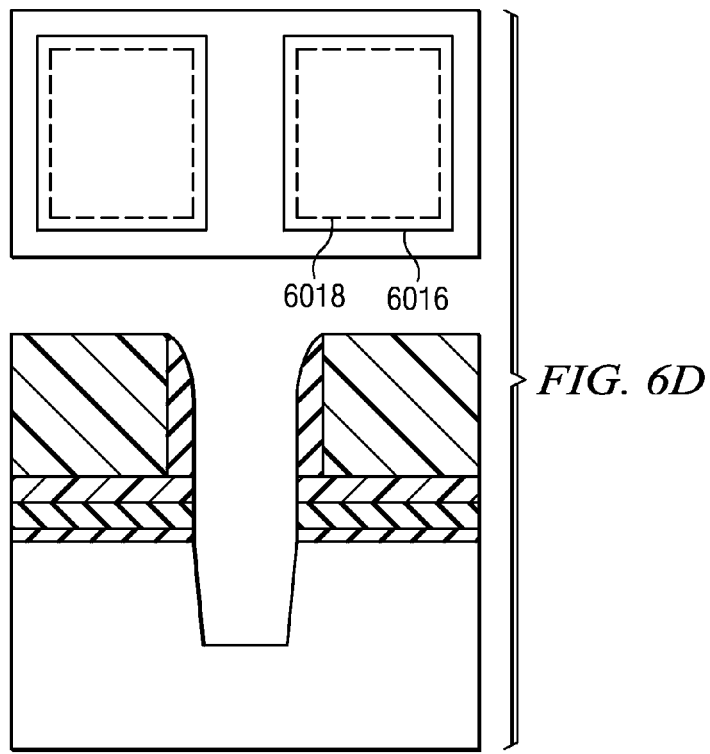

The active pattern 6010 may then be etched into the APF 6008, Si3N4 layer 6006, pad oxide 6004, and substrate 6002 to from the trench for shallow trench isolation (STI) as shown in FIG. 6D. If desired, the photoresist pattern 6010 and the ALD sidewalls 6014 may be removed after etching the APF 6008 and silicon nitride 6006, prior to etching the trench into substrate 6002.

Figure 6E:
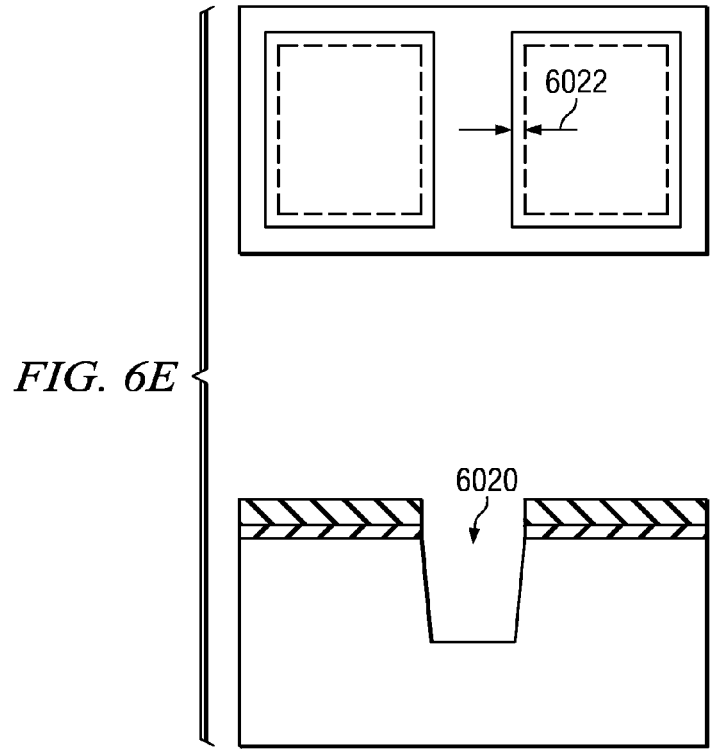

The completed STI space 6020 with the active pattern 6010 and ALD sidewalls 6014 removed is shown in FIG. 6E. In an example SOI embodiment, a minimum active space is reduced from being printed at approximately 70 nm to a sublithographic active space of approximately 30 nm. The space that is saved using this embodiment 6022 may be used to form a sublithographic active-to-active space design rule to reduce integrated circuit area and reduce cost.

The forming of sublithographic features using hole (contact and via), gate tip-to-gate tip, and active space patterns were used to illustrate embodiments of the invention. The invention may also be applied to other patterns, such as metal patterns.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit, comprising the steps:
    forming a photoresist pattern over an underlying layer with a minimum size space or hole, wherein said underlying layer comprises gate material which has been previously etched in a gate length reduction etch to form transistor gates, such that gate tips of two of said transistor gates are connected after said gate length reduction etch is completed, and wherein said photoresist pattern exposes a hole over remaining gate material between said two transistor gates;
    depositing a thin film onto said photoresist pattern using an atomic layer deposition (ALD) process;
    etching said thin film to form sidewalls on said photoresist pattern completely around a perimeter of said minimum size space or hole; and
    etching said underlying layer while said photoresist pattern is in place, forming a sublithographic space, so that said step of etching said underlying layer separates said two transistor gates.

2. The process of claim 1 further comprising;
    forming said photoresist pattern with a non minimum size hole; and
    etching said underlying layer forming a non minimum size hole where a lateral dimension and a longitudinal dimension of said non minimum size hole are reduced by approximately the same amount.

3. The process of claim 1 where said thin film is silicon dioxide with a thickness in the range of 5 nm to 40 nm deposited at about 75 C.

4. The process of claim 1 where said thin film is silicon dioxide with a thickness of approximately 20 nm.

5. The process of claim 1 where a deposition temperature of said ALD process is less than 140 C.

6. A process of forming an integrated circuit, comprising the steps:
    forming a hole photoresist pattern on an underlying layer with a minimum size hole, wherein said underlying layer comprises gate material which has been previously etched in a gate length reduction etch to form transistor gates, such that gate tips of two of said transistor gates are connected after said gate length reduction etch is completed, and wherein said hole photoresist pattern exposes a hole over remaining gate material between said two transistor gates;
    depositing a thin film onto said hole photoresist pattern using an atomic layer deposition (ALD) process, wherein said thin film is silicon dioxide;
    etching said thin film to form sidewalls on said hole photoresist pattern completely around a perimeter of said minimum size hole; and
    etching said underlying layer while said hole photoresist pattern is in place to form a sublithographic hole, wherein said step of etching said underlying layer separates said two transistor gates, and said sublithographic hole is 10 nm to 80 nm below a minimum photolithographic gate tip-to-gate tip space.

7. The process of claim 6 further comprising:
    forming a hole photoresist pattern with a non minimum size hole; and
    etching said underlying layer to form a non sublithographic hole where a lateral and a longitudinal dimension of said non sublithographic hole are reduced by approximately an equal amount.

8. The process of claim 6 where said sublithographic hole is approximately 40 nm below said minimum photolithographic gate tip-to-gate tip space.

\* \* \* \* \*